United States Patent [19]

El Gamal

[11] Patent Number: 5,289,021

[45] Date of Patent: * Feb. 22, 1994

[54] BASIC CELL ARCHITECTURE FOR MASK PROGRAMMABLE GATE ARRAY WITH 3 OR MORE SIZE TRANSISTORS

[75] Inventor: Abbas El Gamal, Palto Alto, Calif.

[73] Assignee: SiArc, Sunnyvale, Calif.

[*] Notice: The portion of the term of this patent subsequent to Oct. 8, 2008 has been disclaimed.

[21] Appl. No.: 717,140

[22] Filed: Jun. 18, 1991

Related U.S. Application Data

[63] Continuation-in-part of Ser. No. 524,183, May 15, 1990, Pat. No. 5,055,716.

[51] Int. Cl.$^5$ ............... H01L 27/02; H01L 27/10
[52] U.S. Cl. ................... 257/206; 257/208; 257/210
[58] Field of Search ............ 357/41, 45, 45 M; 257/202, 204, 206, 208, 210

[56] References Cited

U.S. PATENT DOCUMENTS

| | | | |
|---|---|---|---|
| 4,069,494 | 1/1978 | Grundy | 357/41 |
| 4,611,236 | 9/1986 | Sato | 357/45 |
| 4,649,294 | 3/1987 | McLaughlin | 307/446 |
| 4,682,202 | 7/1987 | Tanizawa | 357/45 |
| 4,727,266 | 2/1988 | Fujii et al. | 307/443 |
| 4,791,320 | 12/1988 | Kawata et al. | 307/446 |
| 4,804,868 | 2/1989 | Masuda et al. | 307/446 |
| 4,816,887 | 3/1989 | Sato | 357/45 |
| 4,829,200 | 5/1989 | Downey | 307/446 |
| 4,945,395 | 7/1990 | Suehiro | 357/45 |
| 4,965,651 | 10/1990 | Wagner | 357/45 |
| 5,038,192 | 8/1991 | Bonneau et al. | 357/45 |
| 5,055,716 | 10/1991 | El Gamal | 357/45 |
| 5,060,046 | 10/1991 | Shintani | 357/45 |
| 5,072,285 | 12/1991 | Ueda et al. | 357/45 |

FOREIGN PATENT DOCUMENTS

| | | | |
|---|---|---|---|
| 57-148363 | 9/1982 | Japan | |
| 58-51536 | 3/1983 | Japan | |
| 58-4553 | 7/1983 | Japan | 357/45 |
| 4-79143 | 1/1984 | Japan | |
| 60-17932 | 1/1985 | Japan | |
| 4-79145 | 4/1985 | Japan | |
| 63-306641 | 12/1988 | Japan | 357/45 M |
| 2-284468 | 11/1990 | Japan | 357/45 |

OTHER PUBLICATIONS

Sporck et al., "A CMOS Master Slice Chip With Versatile Design Features", 1984 IEEE.
Battista et al., "Multiple Function (I/O) Cell Layout", IBM Technical Disclosure Bulletin, vol. 22, No. 7, Dec. 1979.
IBM Technical Disclosure Bulletin, IBM Corp. 1986, vol. 28, No. 8, Jan. 1986, pp. 3358–3561.

*Primary Examiner*—Rolf Hille
*Assistant Examiner*—Mahshid Saadat
*Attorney, Agent, or Firm*—Skjerven, Morrill, MacPherson, Franklin & Friel

[57] ABSTRACT

A highly efficient CMOS cell structure for use in a metal mask programmable gate array, such as a sea-of-gates type gate array, is disclosed herein. In a basic cell, in accordance with one embodiment of the invention, three or more sizes of N-channel transistors and three or more sizes of P-channel transistors are used. The larger size transistors are incorporated in a drive section of a cell, while the smaller size transistors are incorporated in each compute section of a cell. The particular transistors in the compute and drive sections and the arrangements of the compute and drive sections provide a highly efficient use of silicon real estate while enabling the formation of a wide variety of macrocells to be formed.

21 Claims, 8 Drawing Sheets

BASIC CELL ARCHITECTURE FOR MASK PROGRAMMABLE GATE ARRAY WITH 3 OR MORE SIZE TRANSISTORS

CROSS-REFERENCE TO RELATED APPLICATIONS

This application is a continuation-in-part of copending application Ser. No. 07/524,183, filed May 15, 1990, issued as U.S. Pat. No. 5,055,716, entitled "Basic Cell for BiCMOS Gate array," by Abbas El Gamal, incorporated herein by reference.

FIELD OF THE INVENTION

This invention relates to integrated circuits and in particular to Application Specific Integrated Circuits, which include programmable gate arrays.

BACKGROUND OF THE INVENTION

Programmable gate arrays, sometimes containing over one million transistors, are frequently used to create economical Application Specific Integrated Circuits (ASIC). A programmable gate array may be metal mask programmable, electrically programmable, or laser programmable. In a mask programmable gate array, the silicon die containing the unconnected transistors is called a master slice or master image. A user who wishes to customize a master slice uses well-known software programs and predefined logic circuit configurations (macrocells) contained in a macrocell library to selectively interconnect the transistors within the gate array to provide an ASIC.

In one type of metal mask programmable gate array, an array of cells is formed on a chip wherein each cell is comprised of a plurality of unconnected components. In a typical arrangement, there is a variety of types of components in each cell to enable a designer of the macrocells to create various kinds of logic circuits within each cell or by using a combination of cells. Ideally, each cell should contain an optimum number and variety of components so that the designer may create a wide variety of macrocells using the shortest interconnect wire lengths, using a minimum amount of die area, and using other techniques for achieving high performance for each macrocell.

In a programmable gate array structure, CMOS transistors frequently comprise the components of a cell due to the low power consumption of a CMOS device, where an N-channel and a P-channel MOSFET are connected in series between a power supply terminal and ground. Because the gates of these CMOS transistors are made common, one transistor will be off while the other transistor will be on, thus avoiding a low impedance path between the power supply terminal and ground. These CMOS transistors may be used as building blocks to create a wide variety of macrocells.

A conventional CMOS gate array cell is shown in FIG. 1 and comprises a number of equal size N-channel transistors 2 and a number of equal size P-channel transistors 4. Such a cell is inefficient at implementing memory elements such as D-type flip flops and SRAM cells, and its output drive capability is very limited. The transistor sizes typically used in such prior art cells are unnecessarily large for driving nets with a low fanout of, for example, one or two and are insufficient for driving nets with a high fanout exceeding, for example, five. Consequences of using unnecessarily large transistor sizes for driving low fanouts are that the relatively large input capacitances for the logic macrocells result in unnecessarily high dynamic power dissipation and also unnecessarily high loading on clock nets.

Since the typical transistors are too small to adequately drive a fanout exceeding five, two or more macrocells must be connected in parallel, or separate buffers must be introduced in the design. These large resulting macrocells give rise to inefficient chip area utilization and an increase in interconnect length.

Also in the prior art, to improve the efficiency of implementing SRAM cells, CMOS gate array cells with N-channel transistors of two different sizes have been used. The smaller size N-channel transistors are typically less than one third the size of the larger size N-channel transistors. These prior art cells may also incorporate small size P-channel transistors to further improve the efficiency of implementing SRAM cells. However, in such cells, the large transistors are still unnecessarily large for driving low fanout nets and inadequate for driving high fanout nets, while the small transistors are inadequate for driving almost all nets. Generally, for these prior art devices to drive high fanout nets, two or more macrocells must be connected in parallel or separate buffers must be introduced.

In the prior art, since the small size transistors used in SRAMs are typically not used for implementing logic macrocells, such as D-flip flops, these logic macrocells are area inefficient. Moreover, the input capacitance for the macrocells is generally unnecessarily high.

SUMMARY OF THE INVENTION

A highly efficient CMOS cell structure for use in a metal mask programmable gate array, such as a sea-of-gates type gate array, is disclosed herein. In a basic cell, in accordance with one embodiment of the invention, three or more sizes of N-channel transistors and three or more sizes of P-channel transistors are used. The larger size transistors are incorporated in a drive section of a cell, while the smaller size transistors are incorporated in a compute section of a cell. The larger size transistors may be used for driving high fanout nets and even used to perform logic functions, while the smaller transistors may be used to implement SRAM cells and logic functions and for driving low fanout nets.

The particular transistors in the compute and drive sections, and the arrangements of the transistors in the compute and drive sections, provide a highly efficient use of silicon real estate while enabling the formation of a wide variety of macrocells to be formed.

DETAILED DESCRIPTION OF THE PREFERRED EMBODIMENT

Figure 1:
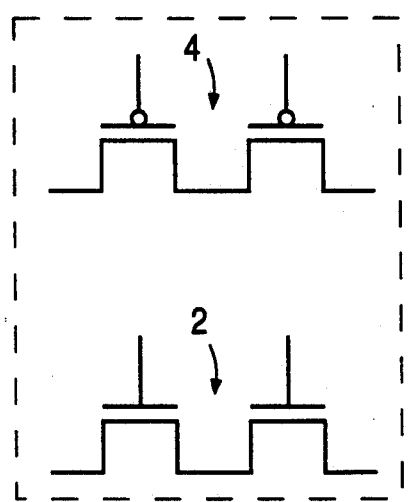
FIG. 1 shows a basic prior art cell.
Figure 2:
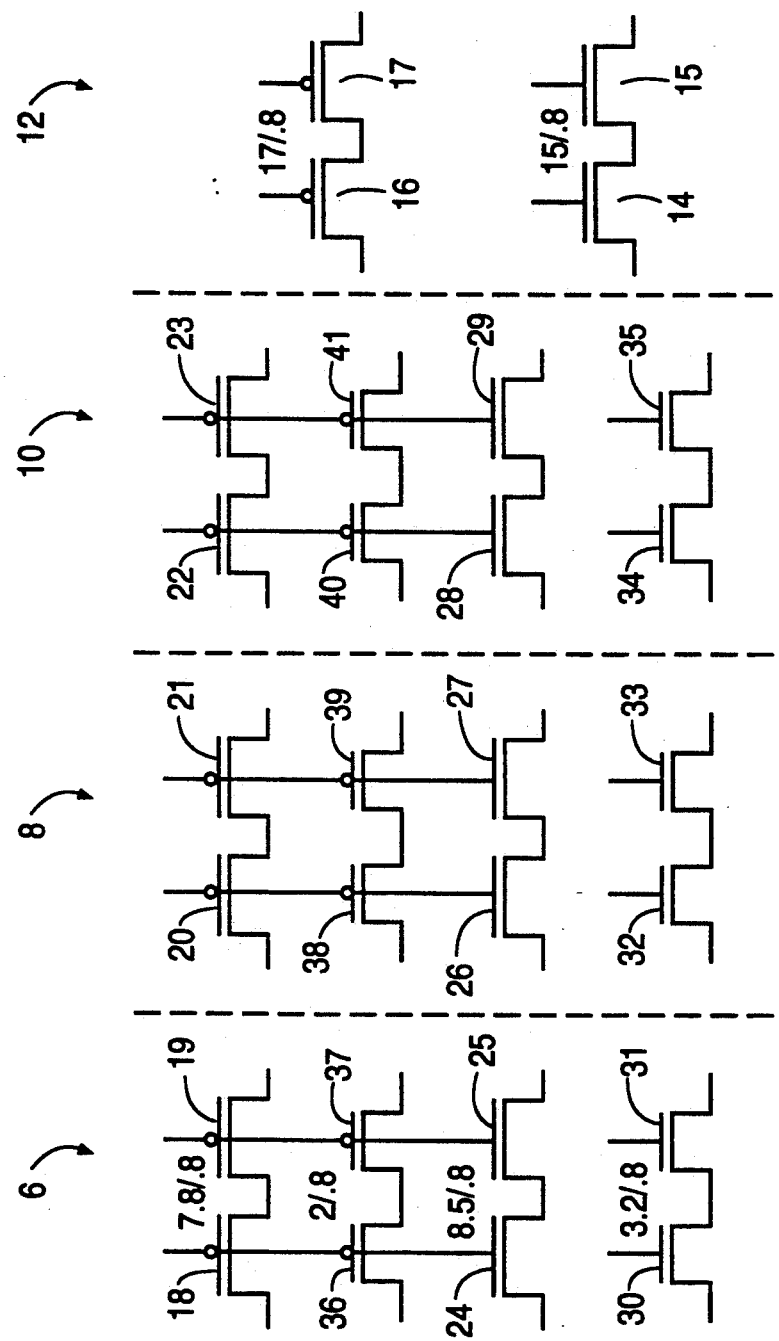
FIG. 2 shows a basic cell schematic for a preferred embodiment in a mask programmable sea-of-gates structure.

The preferred embodiment of the invention is illustrated in FIG. 2, where a single mask programmable gate array cell contains one or more compute sections 6, 8, 10 and may contain a drive sections 12 or share a drive section with another cell. The mask programmable gate array cell shown in FIG. 2 comprises N-channel transistors of three different sizes and P-channel transistors of three different sizes. The largest N-channel transistors 14, 15 and the largest P-channel transistors 16, 17 are located in drive section 12 and have channel widths larger than any transistors in compute sections 6, 8, 10. The medium size P-channel transistors 18–23 and medium size N-channel transistors 24–29 are approximately half the size of the large P and N-channel transistors 14–17. The small N-channel transistors 30–35 are between approximately one-half and one-third the size of the P and N-channel medium size transistors 18–29, and the small P-channel transistors 36–41 are smaller than the small N-channel transistors 30–35. The particular channel widths and lengths (W/L) used in the preferred embodiment are illustrated in FIG. 2. Each compute section 6, 8, 10 is preferably identical.

The preferred embodiment of the cell shown in FIG. 2 comprises three compute sections 6, 8, 10 and one drive section 12, but any number of compute sections and drive sections may be placed adjacent to one another to form a single cell. A single compute section 6, 8, or 10 comprises two medium size N-channel transistors (e.g., 24, 25), two small N-channel transistors (e.g., 30, 31), two medium size P-channel transistors (e.g. 18, 19), and two small P-channel transistors (e.g., 36, 37).

Figure 3A:
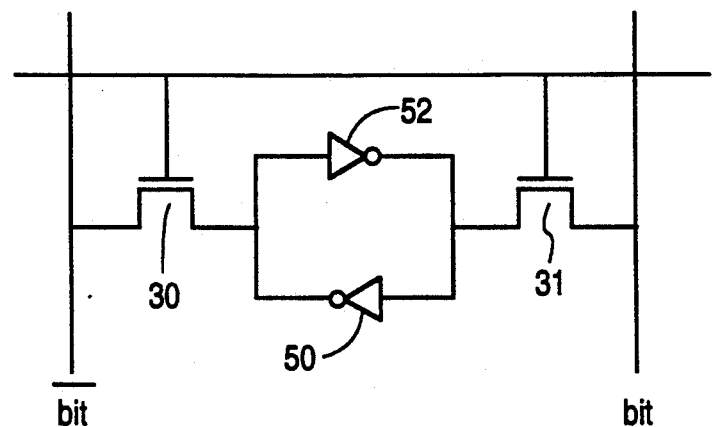
FIGS. 3a and 3b illustrate an SRAM built using a single compute section of the cell of FIG. 2.
Figure 3B:
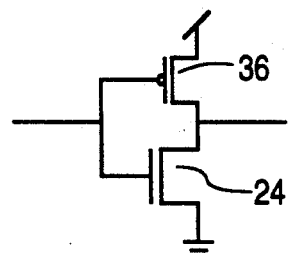

The small and medium size transistors in two compute sections may be used to implement two, six-transistor SRAM cells, one of which is shown in FIG. 3a. In FIG. 3a, the small P-channel transistors 36, 37 shown in FIG. 2 are used as pull-up transistors in CMOS inverters 50 and 52, while the medium N-channel transistors 24, 25 shown in FIG. 2 are used as pull-down transistors in inverters 50 and 52. This is illustrated in FIG. 3b, which shows CMOS inverter 50 or 52. Small N-channel transistors 30, 31 are used as pass transistors in the SRAM of FIG. 3a.

Figure 4:
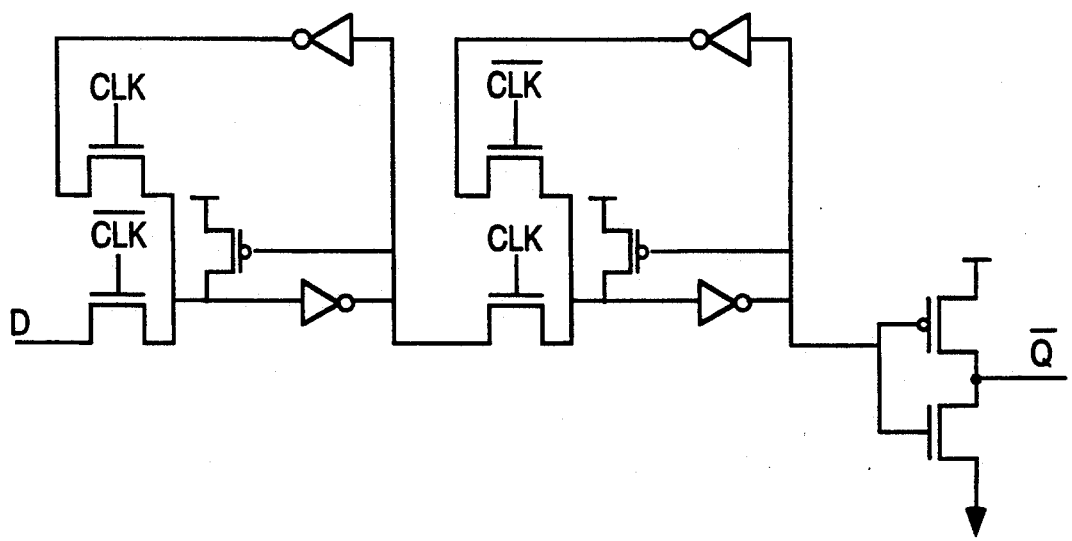
FIGS. 4-7 show various logic circuits or macrocells which may be implemented with the cell structure and array layout shown in FIGS. 2 and 8.

The D-flip flop of FIG. 4 may be constructed using the complete cell of FIG. 2, having three compute sections. Each of the inverters is formed using a medium P-channel transistor (or a medium in parallel with a small P-channel transistor) and a medium N-channel transistor. Other transistors used in FIG. 4 are shown with their relative sizes.

Figure 5:
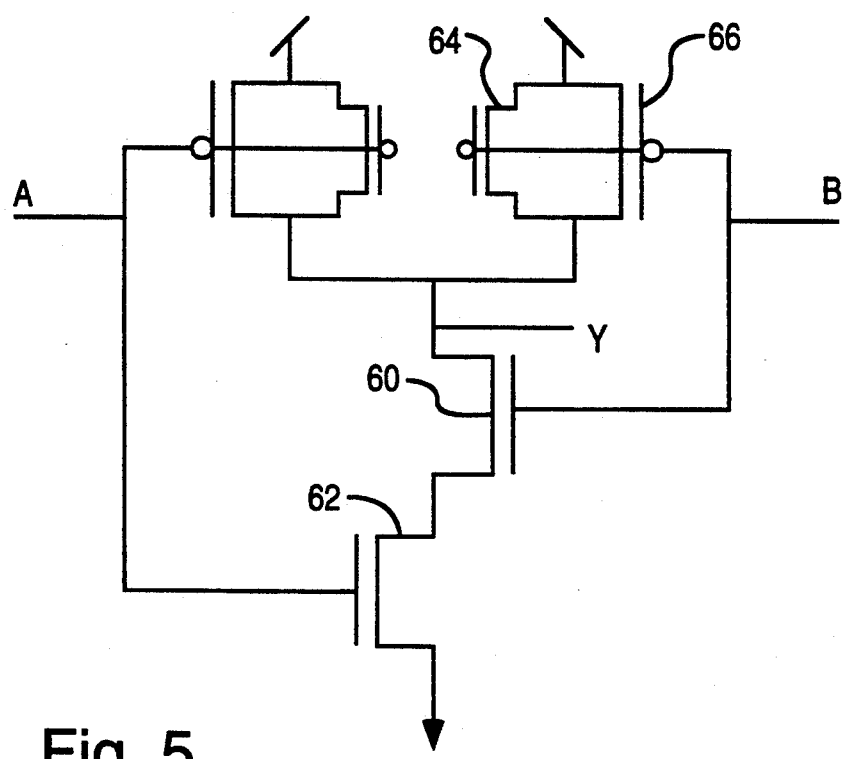

Macrocells for driving low fanout nets (e.g., one to two) may be implemented using only medium and small size transistors, such as the NAND gate of FIG. 5, using only a single compute section. In FIG. 5, serially connected N-channel transistors 60, 62 are medium size. Small and medium size P-channel transistors 64, 66 are connected in parallel for additional drive capability.

Figure 6:
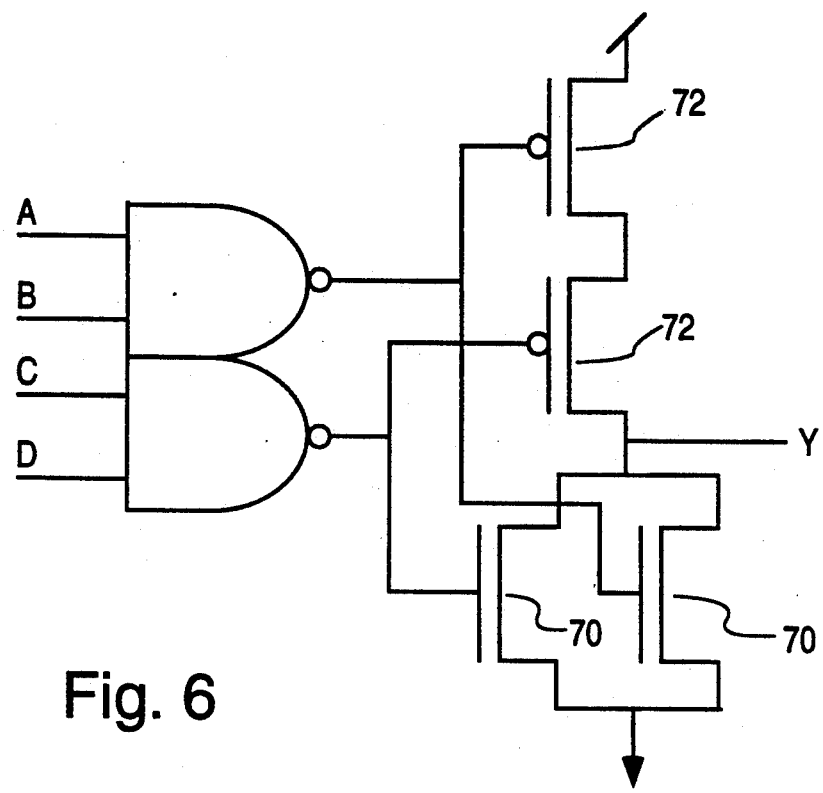

Macrocells for driving medium fanout nets (e.g., three to five) may additionally use the large N and P-channel transistors residing in the drive section as logic devices, such as large N and P-channel transistors 70 and 72, respectively, illustrated in the four-input AND gate of FIG. 6.

Figure 7:
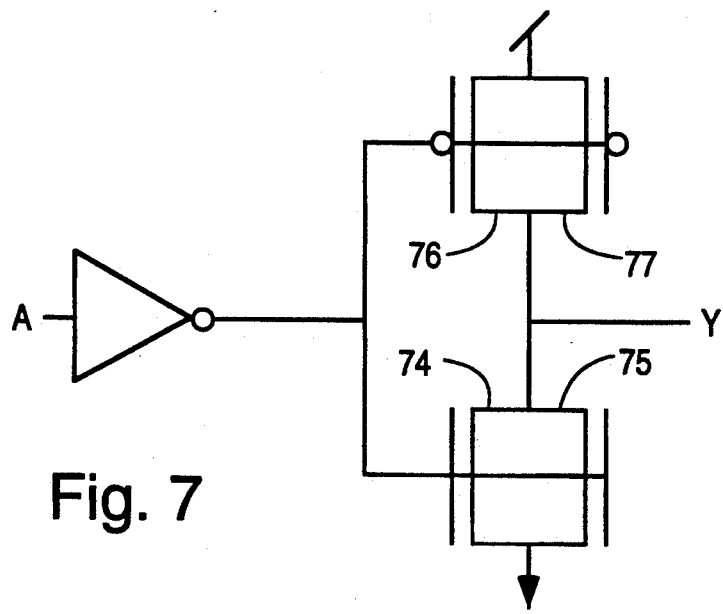

For driving large fanout nets (e.g., greater than five), the transistors in one or more drive sections may be paralleled as shown in FIG. 7 where transistors 74–77 are large transistors.

As seen, the particular devices contained in each of the compute sections of a cell make highly efficient use of silicon real estate. In addition to the significant area savings achieved using the small and medium size transistors to implement logic macrocells, the use of such transistors reduces the input capacitive loading of the macrocells as compared to a conventional gate array. This is especially beneficial for reducing dynamic power dissipation and loading on clock nets.

The polysilicon and diffusion connections between the devices in each compute section of a cell are chosen to ensure routability between transistors within one or more cells to form macrocells. This is important since the transistor sizes in the compute sections are significantly smaller than in a conventional gate array cell, which makes interconnections between the transistors in a cell more difficult.

The choice of the number of compute sections for a cell to the number of drive sections for the cell should be selected to optimize the density of useable gates (i.e., the number of gates per unit area). A low ratio of compute-to-drive sections has the advantage of high drive, but wastes area when implementing large macrocells such as D-flip flops and macrocells with low drive requirements such as SRAM cells. On the other hand, a high ratio of compute-to-drive sections, although more efficient for implementing low drive macrocells and D-flip flops, will result in inefficient implementation of small macrocells (e.g., those having two input gates) and high drive macrocells. The optimal ratio of compute sections-to-drive sections for a cell depends on the statistics of macrocell usage in the target designs and on the method of logic mapping.

Figure 8A:
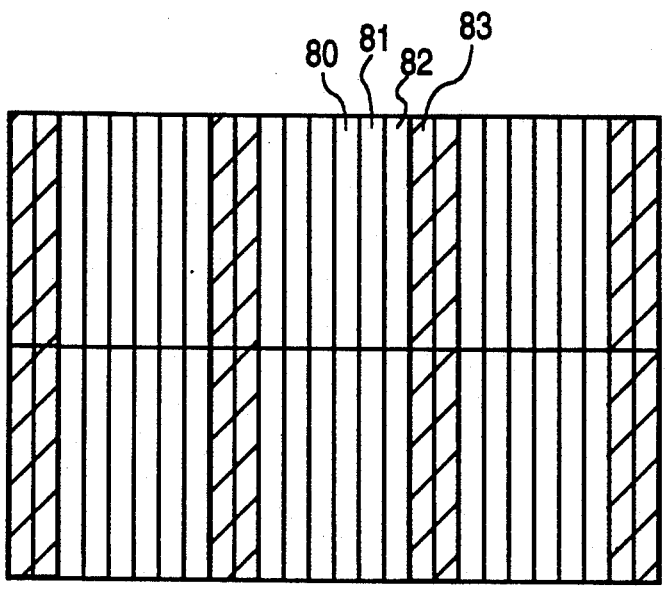
FIGS. 8a and 8b illustrate sample tiling of the compute and drive sections in a mask programmable sea of gates structure.
Figure 8B:
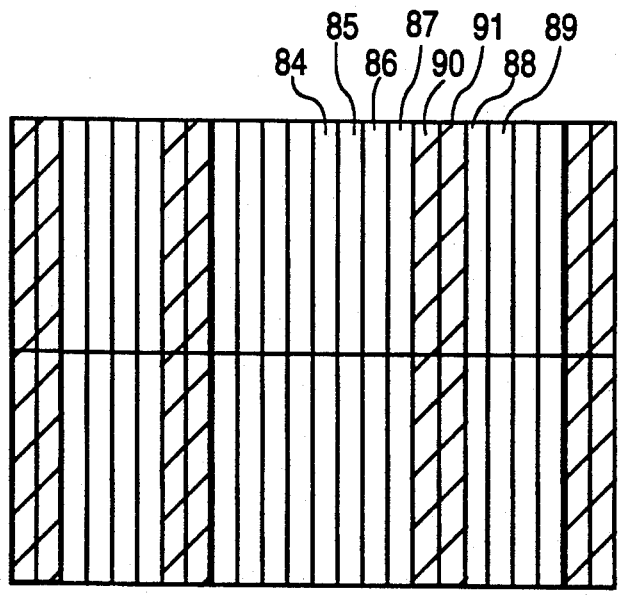

Using an experimental approach, I have determined that a ratio of three compute sections for each drive section, as shown in FIG. 2, appears to achieve the best area utilization. The optimal ratio would, however, change if the macrocell usage statistics of the target designs change. In fact, it may be beneficial to use more than one ratio in the same master image. This is illustrated in FIGS. 8a and 8b, where FIG. 8a shows a uniform master image with three compute sections (e.g., 80, 81, 82) being associated with one drive section (e.g., 83), and FIG. 8b shows a non-uniform master image with either four compute sections (e.g., 84–87) or two compute sections (e.g., 88, 89) associated with a single drive section (e.g., 90 or 91, respectively).

Figure 9:
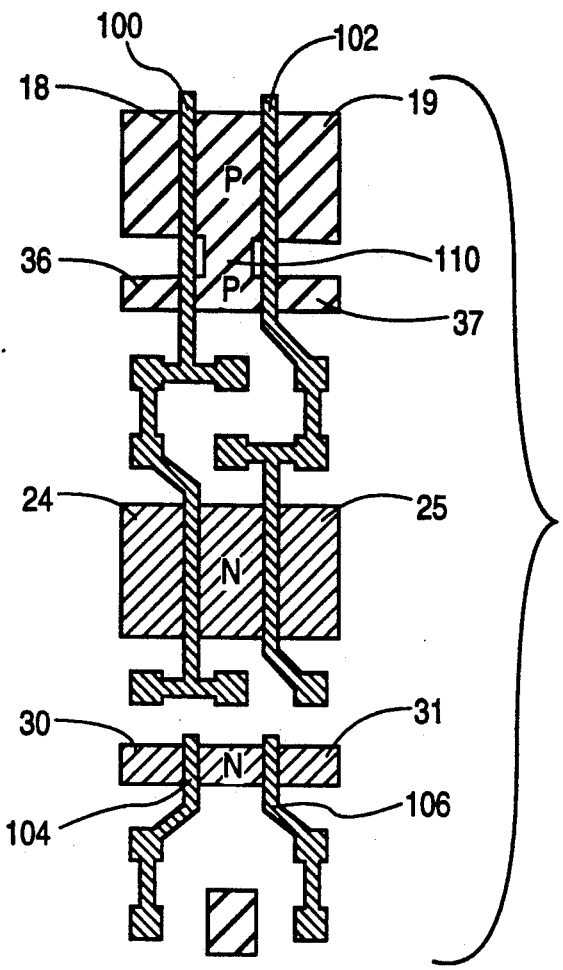
FIG. 9 shows a preferred layout for a single compute section in the basic cell structure of FIG. 2.

A preferred layout for each of the compute sections shown in FIG. 2 is shown in FIG. 9. In FIG. 9, the transistors are labelled to coincide with the transistors in compute section 6 in FIG. 2. As seen from FIG. 9, a single polysilicon gate i is used for controlling transistors 18, 36, and 24 and a single polysilicon gate 102 is used for controlling transistors 19, 37, and 25. Separate gates 104 and 106 control N-channel transistors 30 and 31 so that these transistors may be operated independently, such as the pass transistors 30 and 31 used in the SRAM of FIG. 3. The N and P type source/drain diffusions for the various transistors are shown as the shaded areas in FIG. 9. As seen, the center diffusion for the medium and small P-channel transistors are made common by diffused P-type connector portion 110.

The structure of FIG. 9 may be formed using well known and conventional techniques.

By replacing the large P-channel transistors in drive section 12 of FIG. 2 with an NPN bipolar transistor, a BiNMOS-type driver may be added to the output of macrocells which results in significant performance improvement.

Figure 10A:
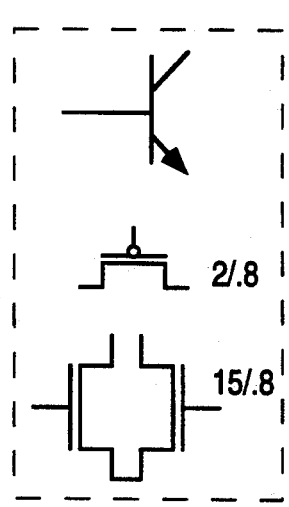
FIGS. 10a–10c illustrate drive sections which may be used in conjunction with the compute sections of this invention.
Figure 10B:
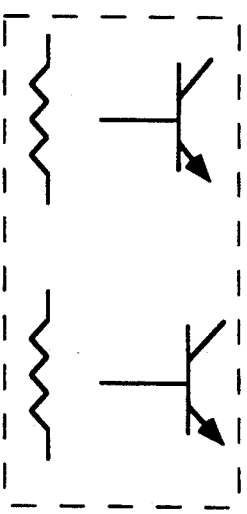
Figure 10C:
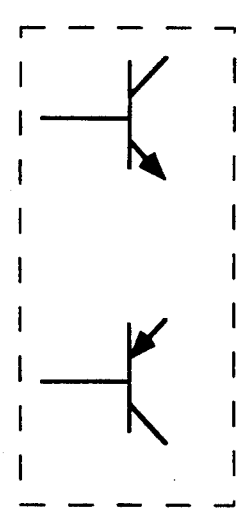

Other drive sections such as one containing two NPN bipolar devices for implementing a full BiCMOS buffer, or a drive section containing one NPN and one PNP bipolar transistor for implementing a complementary BiCMOS buffer, may be used with the disclosed compute sections. FIGS. 10a–10c illustrate three examples of drive sections which may be utilized in the cell of this invention.

Figure 11:
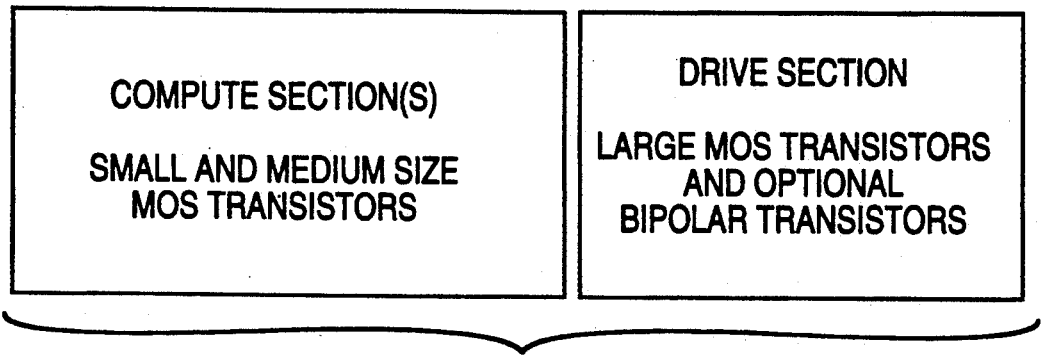
FIG. 11 illustrates a basic cell in accordance with the invention.

A basic cell described in this specification is shown in FIG. 11 essentially comprising one or more compute sections containing small and medium size transistors and one or more drive sections containing large size MOSFET(s) and/or bipolar transistors. If the driver portion of the cell of FIG. 11 were eliminated and the transistors in the compute section(s) made larger to drive larger loads, the resulting cell would still be very advantageous.

Figure 12:
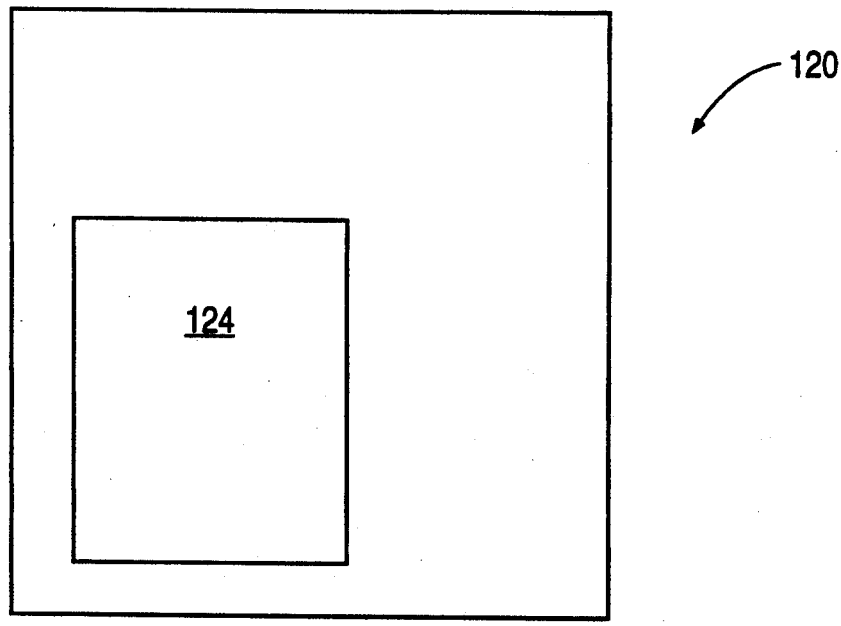
FIG. 12 illustrates an ASIC device incorporating a gate array.

FIG. 12 shows an ASIC 120 which contains array 124 comprised of cells, such as the cell of FIGS. 2, 8, and 11, which may or may not be metallized. In this ASIC, the area of the chip outside of array 124 may contain other circuitry connected to interact with array 124. ASIC 120 may also contain a plurality of arrays 124.

The main differences between the compute section described in this specification and the compute section primarily described in my application Ser. No. 07/524,183, issued as U.S. Pat. No. 5,055,716, are: 1) the addition of a small size P-chnnel transistor in each compute section; 2) not requiring that the medium P-channel transistors have less current handling capability than the small N-channel transistor; 3) a reduction in the size of each compute section; and 4) the details of the polysilicon and diffusion preconnections.

While particular embodiments of the present invention have been shown and described, it will be obvious to those skilled in the art that changes and modifications may be made without departing from this invention in its broader aspects and, therefore, the appended claims are to encompass within their scope also changes and modifications as forward in the true spirit and scope of this invention.

I claim:

1. A basic cell in a mask programmable gate array, said basic cell comprising:
   three sizes of N-channel transistors, where size corresponds to channel width; and
   three sizes of P-channel transistors, where size corresponds to channel width,
   gates of certain ones of said N-channel transistors and P-channel transistors being isolated from gates of certain other ones of said N-channel transistors and P-channel transistors within said basic cell,
   wherein said basic cell is one of a plurality of basic cells wholly located within an interior of said gate array.

2. The basic cell of claim 1 wherein said three sizes of N-channel transistors comprise:
   one or more small size N-channel transistors;
   one or more medium size N-channel transistors; and
   one or more large size N-channel transistors; and said three sizes of P-channel transistors comprise:
   one or more small size P-channel transistors;
   one or more medium size P-channel transistors; and
   one or more large size P-channel transistors,
   wherein said medium size N-channel and P-channel transistors are at least twice the size of said small size N-channel and P-channel transistors, respectively, and
   said large size N-channel and P-channel transistors are larger than said medium size N-channel and P-channel transistors, respectively.

3. A basic cell in a mask programmable gate array, said basic cell comprising:
   one or more substantially rectangular compute sections, each of said compute sections being identical, each of said compute sections containing MOS transistors for being connected to other transistors; and
   one or more substantially rectangular drive sections, each of said drive sections being identical to one another, said one or more drive sections comprising MOS transistors substantially larger than any MOS transistors in said one or more compute sections, said MOS transistors in said drive sections for being connected to other transistors,
   gates of certain ones of said MOS transistors in said basic cell being isolated from gates of certain other ones of said MOS transistors in said basic cell,
   wherein said basic cell is one of a plurality of basic cells wholly located within an interior of said gate array.

4. A basic cell in a mask programmable gate array, said cell comprising:
   one or more substantially rectangular compute sections and one or more drive sections, said one or more drive sections comprising one or more transistors which are different than transistors in said one or more compute sections, said one or more transistors in said drive sections for being connected to other transistors, each compute section comprising:
   one or more small size N-channel transistors;
   one or more medium size N-channel transistors;
   one or more small size P-channel transistors; and
   one or more medium size P-channel transistors,
   said small size N-channel and P-channel transistors having narrower channel widths than said medium size N-channel and P-channel transistors, respectively,
   gates of certain ones of said small size N-channel transistors being isolated from gates of certain ones of said medium size N-channel transistors,
   wherein said basic cell is one of a plurality of basic cells wholly located within an interior of said gate array.

5. The basic cell of claim 4 wherein said channel widths of said small size N-channel and P-channel transistors are less than approximately one-half the channel widths of said medium size N-channel and P-channel transistors, respectively.

6. The basic cell of claim 3 wherein each of said one or more drive sections comprises a plurality of first transistors for providing pull-up drive current in a single macrocell and a plurality of second transistors for providing pull-down drive current in said single macrocell, said plurality of first and second transistors being mask programmable so as to provide said macrocell with a variety of output driving capabilities.

7. The basic cell of claim 3 wherein each of said one or more drive sections comprises one or more first transistors for providing pull-up drive current in a single macrocell and a plurality of second transistors for providing pull-down drive current in said single macrocell, said plurality of second transistors being mask programmable so as to provide said macrocell with a variety of output driving capabilities.

8. The basic cell of claim 3 wherein each of said one or more drive sections comprises a plurality of first transistors for providing pull-up drive current in a single macrocell and one or more second transistors for providing pull-down drive current in said single macrocell, said plurality of first transistors being mask programmable so as to provide said macrocell with a variety of output driving capabilities.

9. A basic cell in a mask programmable gate array, said cell comprising one or more compute sections, a compute section comprising:
one or more small size P-channel transistors;
one or more medium size P-channel transistors;
one or more small size N-channel transistors; and
one or more medium size N-channel transistors,
said medium size P-channel transistors having a channel width at least approximately twice the channel width of said small size P-channel transistors, said medium size N-channel transistors having a channel width at least approximately twice the channel width of said small size N-channel transistors, and said small size P-channel transistors having a channel width smaller than said small size N-channel transistors,
gates of one of said small size P-channel transistors, one of said medium size P-channel transistors, and one of said medium size N-channel transistors being connected in common by polysilicon,
gates of said small size N-channel transistors being isolated from gates of said small and medium size P-channel transistors and from gates of said medium size N-channel transistors,
wherein said basic cell is one of a plurality of basic cells wholly located within an interior of said gate array.

10. The basic cell of claim 9 wherein source regions of at least one of said one or more small size P-channel transistors and at least one of said one or more medium size P-channel transistors are connected by N-type diffusion.

11. The basic cell of claim 9 further comprising one or more drive sections, a drive section comprising one or more transistors which are different than transistors in said one or more compute sections.

12. The basic cell of claim 4 wherein each of said one or more drive sections comprises a plurality of first transistors for providing pull-up drive current in a single macrocell and a plurality of second transistors for providing pull-down drive current in said single macrocell, said plurality of first and second transistors being mask programmable so as to provide said macrocell with a variety of output driving capabilities.

13. The basic cell of claim 4 wherein each of said one or more drive sections comprises one ore more first transistors for providing pull-up drive current in a single macrocell and a plurality of second transistors for providing pull-down drive current in said single macrocell, said plurality of second transistors being mask programmable so as to provide said macrocell with a variety of output driving capabilities.

14. The basic cell of claim 4 wherein each of said one or more drive sections comprises a plurality of first transistors for providing pull-up drive current in a single macrocell and one or more second transistors for providing pull-down drive current in said single macrocell, said plurality of first transistors being mask programmable so as to provide said macrocell with a variety of output driving capabilities.

15. An ASIC containing a gate array comprising a plurality of cells, each of said cells comprising:
three sizes of N-channel transistors, where size corresponds to channel width; and
three sizes of P-channel transistors, where size corresponds to channel width,
gates of certain ones of said N-channel transistors and P-channel transistors being isolated from gates of certain other ones of said N-channel transistors and P-channel transistors within said basic cell,
wherein said cells are one of a plurality of cells wholly located within an interior of said gate array.

16. An ASIC containing a gate array comprising a plurality of cells, each of said cells comprising:
one or more substantially rectangular compute sections and one or more drive sections, said one or more drive sections comprising one or more transistors which are different than transistors in said one or more compute sections, said one or more transistors in said drive sections for being connected to other transistors, each compute section comprising:
one or more small size N-channel transistors;
one or more medium size N-channel transistors;
one or more small size P-channel transistors; and
one or more medium size P-channel transistors,
said small size N-channel and P-channel transistors having narrower channel widths than said medium size N-channel and P-channel transistors, respectively,
gates of certain ones of small size N-channel transistors being isolated from gates of certain ones of said medium size N-channel transistors,
wherein said cells are one of a plurality of cells wholly located within an interior of said gate array.

17. The basic cell of claim 16 wherein each of said one or more drive sections comprises a plurality of first transistors for providing pull-up drive current in a single macrocell and a plurality of second transistors for providing pull-down drive current in said single macrocell, said plurality of first and second transistors being mask programmable so as to provide said macrocell with a variety of output driving capabilities.

18. The basic cell of claim 16 wherein each of said one or more drive sections comprises one or more first transistors for providing pull-up drive current in a single macrocell and a plurality of second transistors for providing pull-down drive current in said single macrocell, said plurality of second transistors being mask programmable so as to provide said macrocell with a variety of output driving capabilities.

19. The basic cell of claim 16 wherein each of said one or more drive sections comprises a plurality of first transistors for providing pull-up drive current in a single macrocell and one or more second transistors for providing pull-down drive current in said single macrocell, said plurality of first transistors being mask programmable so as to provide said macrocell with a variety of output driving capabilities.

20. An ASIC containing a gate array comprising a plurality of cells, each of said cells comprising one or more compute sections, a compute section comprising:
   one or more small size P-channel transistors;
   one or more medium size P-channel transistors;
   one or more small size N-channel transistors; and
   one or more medium size N-channel transistors,
   said medium size P-channel transistors having a channel width at least approximately twice the channel width of said small size P-channel transistors, said medium size N-channel transistors having a channel width at least approximately twice the channel width of said small size N-channel transistors, and said small size P-channel transistors having a channel width smaller than said small size N-channel transistors,
   gates of one of said small size P-channel transistors, one of said medium size P-channel transistors, and one of said medium size N-channel transistors being connected in common by polysilicon,
   gates of said small size N-channel transistors being isolated from gates of said small and medium size P-channel transistors and from gates of said medium size N-channel transistors,
   wherein said cells are located within an interior of said gate array.

21. A basic cell in a mask programmable gate array, said basic cell comprising:
   one or more substantially rectangular compute sections, each of said compute sections being identical, each of said compute sections containing MOS transistors for being connected to other transistors; and
   one or more substantially rectangular drive sections, each of said drive sections being identical to one another, said one ore more drive sections comprising MOS transistors substantially larger than any MOS transistors in said one or more compute sections, said MOS transistors in said drive sections for being connected to other transistors,
   wherein said basic cell is located within an interior of said gate array,
   wherein said one or more substantially rectangular compute sections comprises these compute sections, and said one or more substantially rectangular drive sections comprises one drive section.

* * * * *

UNITED STATES PATENT AND TRADEMARK OFFICE
CERTIFICATE OF CORRECTION

PATENT NO.   :   5,289,021
DATED        :   February 22, 1994
INVENTOR(S)  :   Abbas El Gamal It is certified that error appears in the above-identified patent and that said Letters Patent is hereby corrected as shown below:

Col. 5, line 38, delete "chnnel" and insert --channel--.

Col. 5, line 53 through col. 10, line 4, delete "Claims 1-20" and substitute claims as follows:

--1. A basic cell in a mask programmable gate array prior to transistors in said gate array being interconnected in a programming step, said basic cell comprising:
    one or more substantially rectangular compute sections, each of said compute sections being substantially identical to one another, each of said compute sections containing MOS transistors for being connected to other transistors; and
    one or more substantially rectangular drive sections, each of said drive sections being substantially identical to one another, said one or more drive sections comprising one or more MOS transistors substantially larger than any MOS transistors in said one or more compute sections, gates of said one or more MOS transistors in said drive sections being isolated from gates of said MOS transistors in said compute sections, said one or more MOS transistors in said one or more drive sections for being connected to other transistors,
    wherein said basic cell is one of a plurality of basic cells located within an interior of said gate array prior to said gate array being programmed to interconnect transistors in said compute sections and drive sections, each compute section comprising:

UNITED STATES PATENT AND TRADEMARK OFFICE
CERTIFICATE OF CORRECTION

PATENT NO. : 5,289,021
DATED : February 22, 1994
INVENTOR(S) : Abbas El Gamal

It is certified that error appears in the above-identified patent and that said Letters Patent is hereby corrected as shown below:

two or more small size N-channel transistors, where size corresponds to channel width, wherein at least two of said small size N-channel transistors share a common N-type diffused dopant region;
two or more medium size N-channel transistors, wherein at least two of said medium size N-channel transistors share a common N-type diffused dopant region;
two or more small size P-channel transistors, wherein at least two of said small size P-channel transistors share a common P-type diffused dopant region; and
two or more medium size P-channel transistors, wherein at least two of said medium size P-channel transistors share a common P-type diffused dopant region,
said small size N-channel and P-channel transistors having narrower channel widths than said medium size N-channel and P-channel transistors, respectively,
gates of one or more of said small size N-channel transistors being isolated from gates of said medium size N-channel transistors.

2. The basic cell of Claim 1 wherein said medium size N-channel and P-channel transistors are at least twice the size of said small size N-channel and P-channel transistors, respectively.

3. The basic cell of Claim 1 wherein a gate of one of said small size P-channel transistors, a gate of one of said medium size P-channel transistors, and a gate of one of said medium size N-channel transistors are formed in common so as to be electrically connected.

UNITED STATES PATENT AND TRADEMARK OFFICE
CERTIFICATE OF CORRECTION

PATENT NO. : 5,289,021

DATED : February 22, 1994

INVENTOR(S) : Abbas El Gamal

It is certified that error appears in the above-identified patent and that said Letters Patent is hereby corrected as shown below:

4. The basic cell of Claim 1 wherein said one or more MOS transistors in said one or more drive sections comprises at least one large size N-channel transistor and at least one large size P-channel transistor, where size corresponds to channel width, said at least one large size N-channel transistor and said at least one large size P-channel transistor having channel widths larger than the respective channel widths of said medium size N-channel transistors.

5. The basic cell of Claim 1 wherein said one or more MOS transistors in said one or more drive sections comprises at least one large size N-channel transistor, where size corresponds to channel width, said at least one large size N-channel transistor having a channel width larger than the respective channel widths of said medium size N-channel transistors, said one or more drive sections also including at least one bipolar transistor for providing pull-up drive capabilities.

6. A basic cell in a mask programmable gate array prior to transistors in said gate array being interconnected in a programming step, said cell comprising one or more compute sections, a compute section comprising:
 one or more small size P-channel transistors, where size corresponds to channel width;
 one or more medium size P-channel transistors;
 one or more small size N-channel transistors; and
 one or more medium size N-channel transistors,
 said medium size P-channel transistors having a channel width at least approximately twice the channel width of said small size P-channel transistors, said medium size N-channel transistors having a channel width at least approximately

UNITED STATES PATENT AND TRADEMARK OFFICE
CERTIFICATE OF CORRECTION

PATENT NO. : 5,289,021
DATED : February 22, 1994
INVENTOR(S) : Abbas El Gamal

It is certified that error appears in the above-identified patent and that said Letters Patent is hereby corrected as shown below:

twice the channel width of said small size N-channel transistors, and said small size P-channel transistors having a channel width smaller than said small size N-channel transistors,
 a gate of one of said small size P-channel transistors, a gate of one of said medium size P-channel transistors, and a gate of one of said medium size N-channel transistors being connected in common by polysilicon,
 gates of said small size N-channel transistors being isolated from gates of said small and medium size P-channel transistors and from gates of said medium size N-channel transistors,
 wherein said basic cell is one of a plurality of basic cells wholly located within an interior of said gate array prior to said gate array being programmed to interconnect transistors in said one or more compute sections.

7. The basic cell of Claim 6 wherein source regions of at least one of said one or more small size P-channel transistors and at least one of said one or more medium size P-channel transistors are connected by P-type diffusion.

8. The basic cell of Claim 6 further comprising one or more drive sections, a drive section comprising one or more transistors which have a larger current drive capability than transistors in said one or more compute sections, gates of said transistors in said drive sections being isolated from gates of said transistors in said compute sections.

UNITED STATES PATENT AND TRADEMARK OFFICE
CERTIFICATE OF CORRECTION

PATENT NO. : 5,289,021
DATED : February 22, 1994
INVENTOR(S) : Abbas El Gamal

It is certified that error appears in the above-identified patent and that said Letters Patent is hereby corrected as shown below:

9. An ASIC containing a gate array comprising a plurality of cells, each of said cells comprising:
one or more substantially rectangular compute sections, each of said compute sections being substantially identical to one another, each of said compute sections containing MOS transistors for being connected to other transistors; and
one or more substantially rectangular drive sections, each of said drive sections being substantially identical to one another, said one or more drive sections comprising one or more MOS transistors substantially larger than any MOS transistors in said one or more compute sections, gates of said one or more MOS transistors in said drive sections being isolated from gates of said MOS transistors in said compute sections, said one or more MOS transistors in said one or more drive sections for being connected to other transistors,
wherein said cells are located within an interior of said array, each compute section comprising:
two or more small size N-channel transistors, where size corresponds to channel width, wherein at least two of said small size N-channel transistors share a common N-type diffused dopant region;
two or more medium size N-channel transistors, wherein at least two of said medium size N-channel transistors share a common N-type diffused dopant region;
two or more small size P-channel transistors, wherein at least two of said small size P-channel transistors share a common P-type diffused dopant region; and
two or more medium size P-channel transistors, wherein at least two of said medium size P-channel transistors share a common P-type diffused dopant region;

UNITED STATES PATENT AND TRADEMARK OFFICE
CERTIFICATE OF CORRECTION

PATENT NO.    :   5,289,021
DATED         :   February 22, 1994
INVENTOR(S)   :   Abbas El Gamal It is certified that error appears in the above-identified patent and that said Letters Patent is hereby corrected as shown below:

```
     said small size N-channel and P-channel transistors
having narrower channel widths than said medium size
N-channel and P-channel transistors, respectively,
     gates of one or more of said small size N-channel
transistors being isolated from gates of said medium size
N-channel transistors.

10.  The ASIC of Claim 9 wherein said one or more MOS
transistors in said one or more drive sections comprises at
least one large size N-channel transistor and at least one
large size P-channel transistor, where size corresponds to
channel width, said at least one large size N-channel
transistor and said at least one large size P-channel
transistor having channel widths larger than the respective
channel widths of said medium size N-channel and P-channel
transistors.
     11.  An ASIC containing a gate array comprising a
plurality of cells, each of said cells comprising one or
more compute sections, a compute section comprising:
     one or more small size P-channel transistors, where
size corresponds to channel width;
     one or more medium size P-channel transistors;
     one or more small size N-channel transistors; and
     one or more medium size N-channel transistors,
     said medium size P-channel transistors having a channel
width at least approximately twice the channel width of said
small size P-channel transistors, said medium size N-channel
transistors having a channel width at least approximately
twice the channel width of said small size N-channel
transistors, and said small size P-channel transistors
having a channel width smaller than said small size
N-channel transistors,
```

UNITED STATES PATENT AND TRADEMARK OFFICE
CERTIFICATE OF CORRECTION

PATENT NO.    :   5,289,021
DATED         :   February 22, 1994
INVENTOR(S)   :   Abbas El Gamal It is certified that error appears in the above-identified patent and that said Letters Patent is hereby corrected as shown below:

a gate of one of said small size P-channel transistors, a gate of one of said medium size P-channel transistors, and a gate of one of said medium size N-channel transistors being connected in common by polysilicon,
    gates of said small size N-channel transistors being isolated from gates of said small and medium size P-channel transistors and from gates of said medium size N-channel transistors,
    wherein said cells are located within an interior of said gate array.

12. The basic cell of Claim 1 wherein each of said one or more drive sections comprises a plurality of first transistors for providing pull-up drive current in a single macrocell and a plurality of second transistors for providing pull-down drive current in said single macrocell, said plurality of first and second transistors being mask programmable so as to provide said macrocell with a variety of output driving capabilities.

13. The basic cell of Claim 1 wherein each of said one or more drive sections comprises one or more first transistors for providing pull-up drive current in a single macrocell and a plurality of second transistors for providing pull-down drive current in said single macrocell, said plurality of second transistors being mask programmable so as to provide said macrocell with a variety of output driving capabilities.

14. The basic cell of Claim 1 wherein each of said one or more drive sections comprises a plurality of first transistors for providing pull-up drive current in a single macrocell and one or more second transistors for providing

UNITED STATES PATENT AND TRADEMARK OFFICE
CERTIFICATE OF CORRECTION

PATENT NO.   :   5,289,021
DATED        :   February 22, 1994
INVENTOR(S)  :   Abbas El Gamal It is certified that error appears in the above-identified patent and that said Letters Patent is hereby corrected as shown below:

pull-down drive current in said single macrocell, said plurality of first transistors being mask programmable so as to provide said macrocell with a variety of output driving capabilities.

15. The basic cell of Claim 8 wherein each of said one or more drive sections comprises a plurality of first transistors for providing pull-up drive current in a single macrocell and a plurality of second transistors for providing pull-down drive current in said single macrocell, said plurality of first and second transistors being mask programmable so as to provide said macrocell with a variety of output driving capabilities.

16. The basic cell of Claim 8 wherein each of said one or more drive sections comprises one or more first transistors for providing pull-up drive current in a single macrocell and a plurality of second transistors for providing pull-down drive current in said single macrocell, said plurality of second transistors being mask programmable so as to provide said macrocell with a variety of output driving capabilities.

17. The basic cell of Claim 8 wherein each of said one or more drive sections comprises a plurality of first transistors for providing pull-up drive current in a single macrocell and one or more second transistors for providing pull-down drive current in said single macrocell, said plurality of first transistors being mask programmable so as to provide said macrocell with a variety of output driving capabilities.

UNITED STATES PATENT AND TRADEMARK OFFICE
CERTIFICATE OF CORRECTION

PATENT NO.   :   5,289,021
DATED        :   February 22, 1994
INVENTOR(S)  :   Abbas El Gamal It is certified that error appears in the above-identified patent and that said Letters Patent is hereby corrected as shown below:

18. The basic cell of Claim 9 wherein each of said one or more drive sections comprises a plurality of first transistors for providing pull-up drive current in a single macrocell and a plurality of second transistors for providing pull-down drive current in said single macrocell, said plurality of first and second transistors being mask programmable so as to provide said macrocell with a variety of output driving capabilities.

19. The basic cell of Claim 9 wherein each of said one or more drive sections comprises one or more first transistors for providing pull-up drive current in a single macrocell and a plurality of second transistors for providing pull-down drive current in said single macrocell, said plurality of second transistors being mask programmable so as to provide said macrocell with a variety of output driving capabilities.

UNITED STATES PATENT AND TRADEMARK OFFICE
CERTIFICATE OF CORRECTION

PATENT NO. : 5,289,021
DATED : February 22, 1994
INVENTOR(S) : Abbas El Gamal

It is certified that error appears in the above-indentified patent and that said Letters Patent is hereby corrected as shown below:

20. The basic cell of Claim 9 wherein each of said one or more drive sections comprises a plurality of first transistors for providing pull-up drive current in a single macrocell and one or more second transistors for providing pull-down drive current in said single macrocell, said plurality of first transistors being mask programmable so as to provide said macrocell with a variety of output driving capabilities.--

Signed and Sealed this

Thirtieth Day of May, 1995

Attest:

BRUCE LEHMAN

*Attesting Officer*   *Commissioner of Patents and Trademarks*

UNITED STATES PATENT AND TRADEMARK OFFICE
CERTIFICATE OF CORRECTION

PATENT NO.  : 5,289,021
DATED       : February 22, 1994
INVENTOR(S) : Abbas El Gamal It is certified that error appears in the above-identified patent and that said Letters Patent is hereby corrected as shown below:

In Claim 21, column 10, line 22, change "these" to --three--.

Signed and Sealed this

Fifteenth Day of August, 1995

Attest:

BRUCE LEHMAN

*Attesting Officer*    *Commissioner of Patents and Trademarks*